US011316045B2

(12) United States Patent
Stamper et al.

(10) Patent No.: US 11,316,045 B2
(45) Date of Patent: Apr. 26, 2022

(54) VERTICAL FIELD EFFECT TRANSISTOR (FET) WITH SOURCE AND DRAIN STRUCTURES

(71) Applicant: GLOBALFOUNDRIES U.S. INC., Santa Clara, CA (US)

(72) Inventors: Anthony K. Stamper, Burlington, VT (US); Aaron L. Vallett, Jericho, VT (US); Steven M. Shank, Jericho, VT (US); John J. Ellis-Monaghan, Grand Isle, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 54 days.

(21) Appl. No.: 16/691,691

(22) Filed: Nov. 22, 2019

(65) Prior Publication Data

US 2021/0159336 A1 May 27, 2021

(51) Int. Cl.
| | |
|---|---|
| *H01L 29/78* | (2006.01) |
| *H01L 29/423* | (2006.01) |
| *H01L 29/08* | (2006.01) |
| *H01L 29/45* | (2006.01) |
| *H01L 29/66* | (2006.01) |
| *H01L 29/417* | (2006.01) |
| H01L 29/49 | (2006.01) |
| H01L 29/51 | (2006.01) |

(52) U.S. Cl.
CPC ...... *H01L 29/7827* (2013.01); *H01L 29/0847* (2013.01); *H01L 29/41741* (2013.01); *H01L 29/4236* (2013.01); *H01L 29/456* (2013.01); *H01L 29/66666* (2013.01); *H01L 29/495* (2013.01); H01L 29/4966 (2013.01); H01L 29/517 (2013.01)

(58) Field of Classification Search
CPC ............ H01L 29/7827; H01L 29/4236; H01L 29/0847; H01L 29/456; H01L 29/66666; H01L 29/41741; H01L 29/495; H01L 29/517; H01L 29/4966
USPC .......................................................... 257/330
See application file for complete search history.

(56) References Cited

U.S. PATENT DOCUMENTS

| | | | |
|---|---|---|---|
| 5,264,716 A | 11/1993 | Kenney | |
| 6,252,277 B1* | 6/2001 | Chan | ................. H01L 29/66621 257/330 |
| 6,576,945 B2 | 6/2003 | Mandelman et al. | |

(Continued)

OTHER PUBLICATIONS

Jaffe et al., "Improvements in SOI technology for RF switches", IEEE, 15th Topical Meeting on Silicon Monolithic Integrated Circuits in RF Systems, 2015, 3 pages.

(Continued)

*Primary Examiner* — Mohammad M Hoque
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to vertical field effect transistors (FETS) and methods of manufacture. The structure includes: a substrate material; at least one vertically oriented gate structure extending into the substrate material and composed of a gate dielectric material and conductive gate material; and vertically oriented source/drain regions extending into the substrate material and composed of conductive dopant material and a silicide on the source/drain regions.

20 Claims, 4 Drawing Sheets

(56) References Cited

U.S. PATENT DOCUMENTS

| | | | |
|---|---|---|---|
| 6,812,105 B1 | 11/2004 | Dokumaci et al. | |
| 7,594,773 B2 | 9/2009 | Blanchard, Jr. et al. | |
| 7,994,583 B2 | 8/2011 | Inaba | |
| 9,287,271 B2 | 3/2016 | Wang et al. | |
| 2006/0060916 A1* | 3/2006 | Girdhar | H01L 29/861 257/330 |
| 2010/0006928 A1* | 1/2010 | Pan | H01L 29/407 257/330 |
| 2013/0264639 A1* | 10/2013 | Glass | H01L 21/28525 257/335 |
| 2014/0103414 A1* | 4/2014 | Koldiaev | H01L 27/1203 257/296 |
| 2015/0255578 A1* | 9/2015 | Chang | H01L 29/7848 257/343 |
| 2015/0349091 A1* | 12/2015 | Yilmaz | H01L 29/4975 438/270 |
| 2015/0380503 A1* | 12/2015 | Nakano | H01L 29/66613 257/77 |
| 2018/0108775 A1* | 4/2018 | More | H01L 29/7848 |
| 2019/0103311 A1* | 4/2019 | Tsai | H01L 21/76889 |
| 2020/0105754 A1* | 4/2020 | Murthy | H01L 29/785 |

OTHER PUBLICATIONS

Moyer, "How It's Built: Micron/Intel 3D NAND", Electronic Engineering Journal, Feb. 1, 2016, 5 pages.

\* cited by examiner

US 11,316,045 B2

VERTICAL FIELD EFFECT TRANSISTOR (FET) WITH SOURCE AND DRAIN STRUCTURES

FIELD OF THE INVENTION

The present disclosure relates to semiconductor structures and, more particularly, to a vertical field effect transistor (FET) and methods of manufacture.

BACKGROUND

Switches are commonly used in electronic devices including mobile devices such as cellular telephones. Switches can be fabricated using conventional CMOS technologies. In conventional CMOS technologies, the switch is fabricated as a field effect transistor (FET). In these technologies, the switch is fabricated using a single level poly layout on a silicon on insulator (SOI) wafer. The use of these types of switches in cellphones is growing exponentially per year due to increased cellular and WiFi bands, carrier aggregation, G5, etc. However, these switches are expensive to manufacture and also use a large amount of valuable real estate on the chip.

SUMMARY

In an aspect of the disclosure, a structure comprises: a substrate material; at least one vertically oriented gate structure extending into the substrate material and composed of a gate dielectric material and conductive gate material; and vertically oriented source/drain regions extending into the substrate material and composed of conductive dopant material and a silicide on the source/drain regions.

In an aspect of the disclosure, a structure comprising: a substrate material; at least one vertically oriented gate trench extending into the substrate material; a gate dielectric material lining the at least one vertically oriented gate trench; conductive gate material filling a remaining portion of the at least one vertically oriented gate trench; at least one vertically oriented source/drain trench extending into the substrate material; lining the at least one vertically oriented source/drain trench with a conductive dopant; silicide on the at least one vertically oriented source/drain trench; and silicide on a planar surface of the substrate material, adjacent to the conductive dopant material and on the conductive gate material.

In an aspect of the disclosure, a method comprises: forming at least one vertical trench in substrate material; lining the at least one vertical trench with a gate dielectric material; filling a remaining portion the at least one vertical trench with gate material; forming at least one vertically oriented source/drain trench; lining the at least one vertically oriented source/drain trench with a solid source dopant material; and siliciding a material on the solid source dopant material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a vertical field effect transistor (FET) and methods of manufacture. More specifically, the present disclosure relates to a vertical FET in trench with a solid source dopant for the source/drain, in separate trench. Advantageously, the vertical FET described herein provides a significantly higher device density (e.g., transistor switches) compared to known structures.

In embodiments, the FET is formed vertically, with source/drain regions formed in a first trench and gate poly (or metal material) in a separate trench. In embodiments, a FET body is provided between the trenches of the source/drain regions. More specifically, the FET body is formed by semiconductor material (e.g., silicon) vertically between the trench of the source/drain and the gate trench. A vertical channel is provided with respect to the semiconductor (e.g., silicon) wafer. In embodiments, a PFET or NFET switch can be formed in a manner described herein.

In more specific embodiments, the FET is a vertically stacked FET with a source/drain in a first deep trench and gate poly (or workfunction metal material) in a second deep trench. The source/drain is formed with solid source dopant (diffusion) on trench sidewalls. For example, the solid source dopant can be arsenic silicate glass (AsG) or borosilicate glass (BSG), lined on the sidewalls of the source/drain deep trench to improve conductivity. In addition, the sidewalls of the source/drain trench can have silicide over the solid source dopant. The gate trench, on the other hand, includes oxidized sidewalls acting as gate dielectric material and gate poly to form the vertical gate structure. Optionally, the gate trench can be lined with high-K dielectric material and filled with metal gate materials.

The vertical FET of the present disclosure can be manufactured in a number of ways using a number of different tools. In general, though, the methodologies and tools are used to form structures with dimensions in the micrometer and nanometer scale. The methodologies, i.e., technologies, employed to manufacture the vertical FET of the present disclosure have been adopted from integrated circuit (IC) technology. For example, the structures are built on wafers and are realized in films of material patterned by photolithographic processes on the top of a wafer. In particular, the fabrication of the vertical FET uses three basic building blocks: (i) deposition of thin films of material on a substrate, (ii) applying a patterned mask on top of the films by photolithographic imaging, and (iii) etching the films selectively to the mask.

Figure 1:
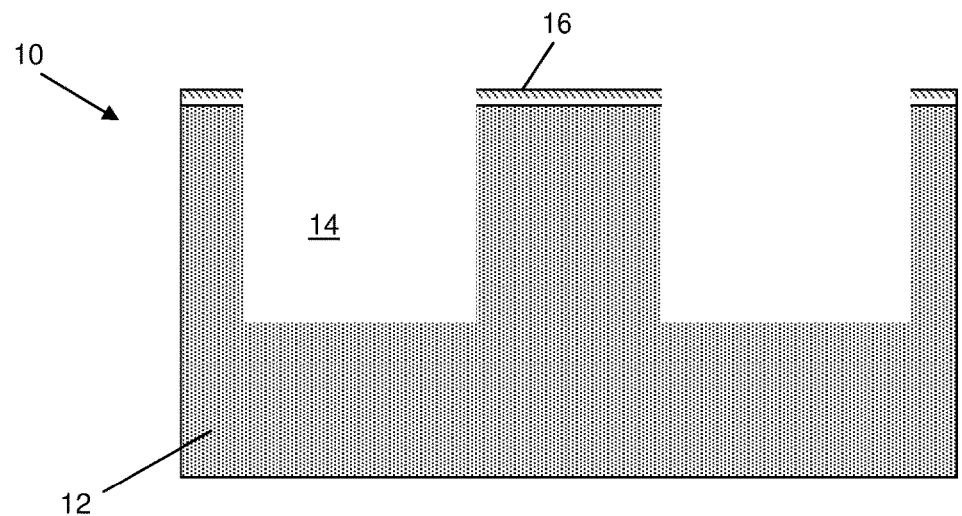
FIG. 1 shows a structure with trenches, amongst other features, and respective fabrication processes in accordance with aspects of the present disclosure.

FIG. 1 shows a structure with trenches, amongst other features, and respective fabrication processes in accordance with aspects of the present disclosure. The structure 10 includes a substrate 12 with a plurality of trenches 14. The trenches 14 can be used to form vertical gates. In optional embodiments, a pad nitride or oxide or oxide nitride pad film 16 can be deposited over the surface of the substrate 12. The substrate 12 can be a thick film semiconductor on insulator (SOI) wafer or bulk wafer. The substrate 12 can have a thickness of about 10 µm or more; although other dimensions are also contemplated herein. In embodiments, the substrate 12 can be a P-type wafer (~1 ohm-cm).

In embodiments, the bulk wafer can be Si material; although other semiconductor material is also contemplated herein. For example, the substrate 12 may be composed of any suitable material including, but not limited to, Si, SiGe, SiGeC, SiC, GaAs, InAs, InP, and other III/V or II/VI compound semiconductors. Alternatively, in the SOI technology implementation, the substrate may include an insulator layer on top of a semiconductor layer. The insulator layer comprises any suitable material including a buried oxide layer (BOX) formed by any suitable process such as separation by implantation of oxygen (SIMOX), oxidation, deposition, etc. Another semiconductor layer is provided on top of the insulator layer, which can be fabricated using wafer bonding, and/or other suitable methods.

Still referring to FIG. 1, the trenches 14 are deep trenches formed by conventional lithography and etching methods known to those of skill in the art. For example, a resist formed over the pad film 16 is exposed to energy (light) to form a pattern (opening). An etching process with a selective chemistry, e.g., reactive ion etching (RIE), will be used to form one or more trenches 14 in the substrate 12 and extending through the pad film 16 through the openings of the resist. The resist can be removed by a conventional oxygen ashing process or other known stripants. The trenches 14 can be approximately 6 µm deep; although other dimensions are also contemplated herein.

Figure 2:
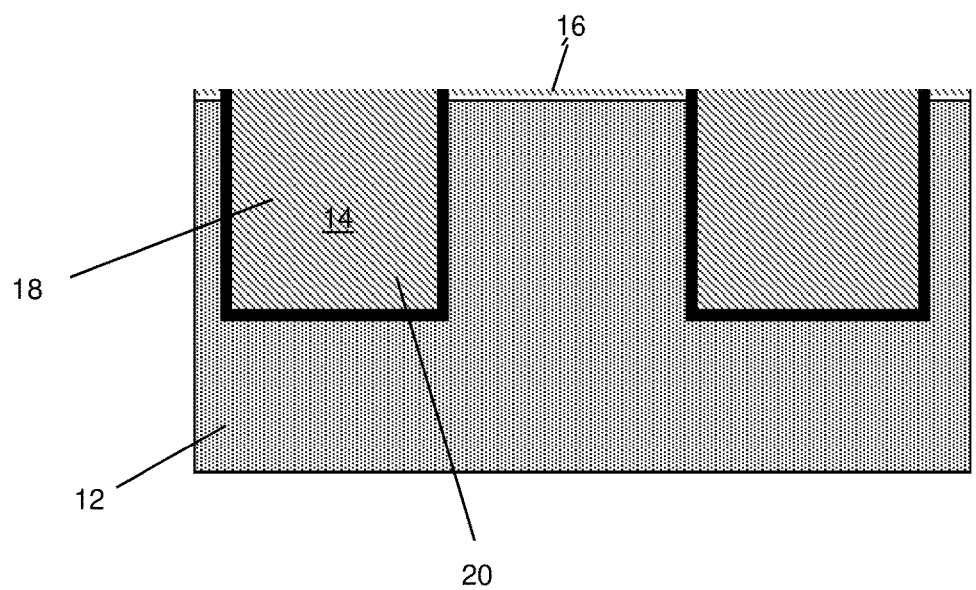
FIG. 2 shows the trenches lined with a gate dielectric material and filled with gate material, amongst other features, and respective fabrication processes in accordance with aspects of the present disclosure.

In FIG. 2, the trenches 14 are lined with a gate dielectric material 18. In embodiments, the gate dielectric material 18 is an oxide material formed by an oxidation process. In alternative embodiments, the gate dielectric material 18 is a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The high-k gate dielectric material can be deposited by a conventional deposition process, e.g., atomic layer deposition (ALD) or plasma enhanced deposition methods (PECVD), as some examples.

Following the deposition of the gate dielectric material 18, poly material 20 can be deposited within the remaining portion of the trenches 14. The poly material 20 is preferably an arsenic doped poly material; although other N-type materials are also contemplated such as phosphorus (P), antimony (Sb), or bismuth (Bi). In alternative embodiments, P-type dopants, e.g., boron, can be used with a N-type wafer. Any residual material on top of the substrate 12 (or pad film 16) may be removed by a conventional chemical mechanical polishing (CMP) process.

In alternative embodiments, metal materials may be used in combination with the high-k dielectric material. These metal materials can be workfunction metals for a p-channel FET or a n-channel FET, depending on the desired device. Examples of the workfunction materials for a p-channel FET include Ti, TiAlC, Al, TiAl, TaN, TaAlC, TiN, TiC and Co. In one embodiment, TiN is used for a p-channel FET. Examples of the workfunction materials for an n-channel FET include TiN, TaN, TaAlC, TiC, TiAl, TaC, Co, Al, TiAl, HfTi, TiSi, TaSi or TiAlC. In one embodiment, TaAlC, TiAl or Al is used for an n-channel FET. The workfunction materials may be formed by chemical vapor deposition (CVD), physical vapor deposition (PVD) including sputtering, ALD or other suitable method.

Figure 3:
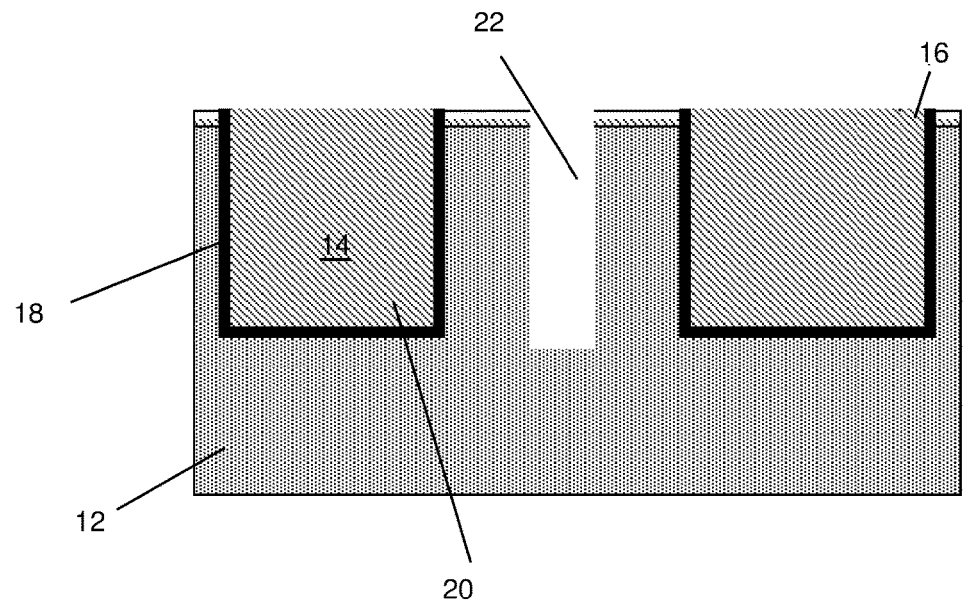
FIG. 3 shows a source/drain trench formed in the substrate, amongst other features, and respective fabrication processes in accordance with aspects of the present disclosure.
Figure 8:
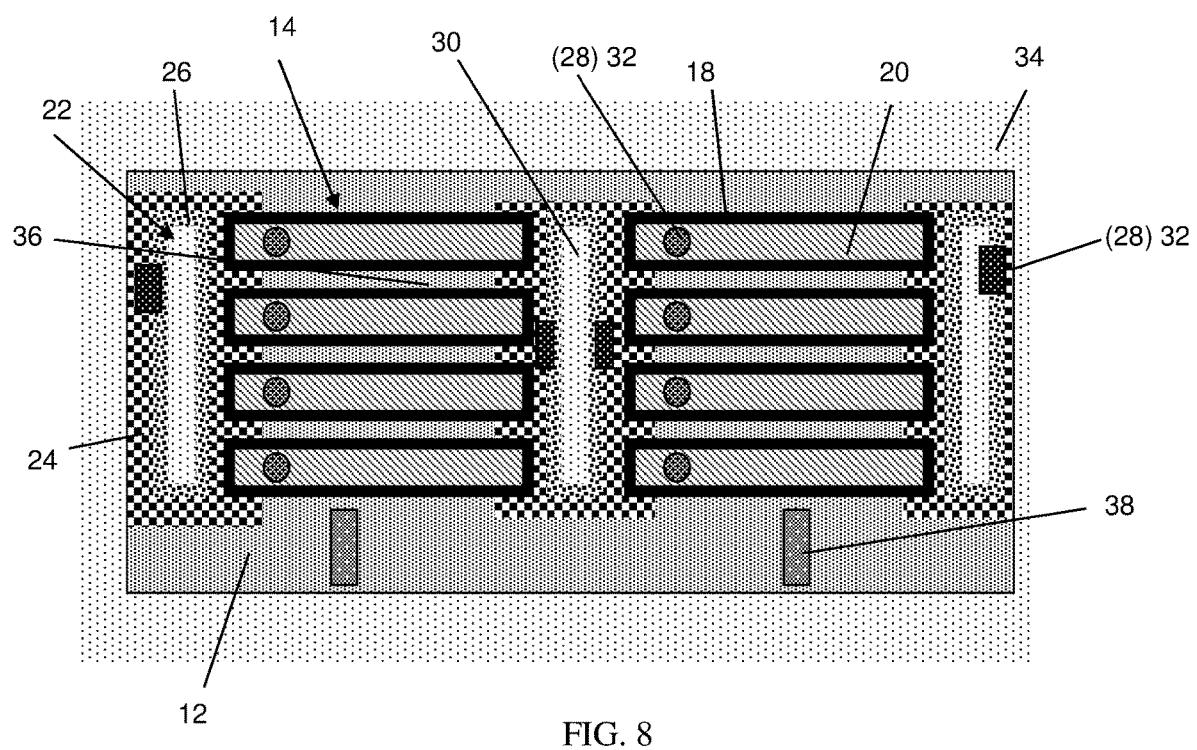
FIG. 8 shows a top planar view of the structure shown in FIG. 7.

Referring now to FIG. 3, a trench 22 is formed in the substrate 12 for source/drain regions. In embodiments, the trench 22 is a deep trench positioned between the trenches 14. As shown in FIG. 8, for example, the trench 22 is orthogonal to the trenches 14. Moreover, as should be understood by those of skill in the art, a single trench 22 may be located at the ends of several parallel aligned trenches 14 on both sides of the trench 22. The trench 22 can be fabricated by conventional lithography and etching processes with the pad film 16 still provided on the substrate 12, as already described herein. The trench 22 can be approximately 6 µm deep; although other dimensions are also contemplated herein.

Figure 4:
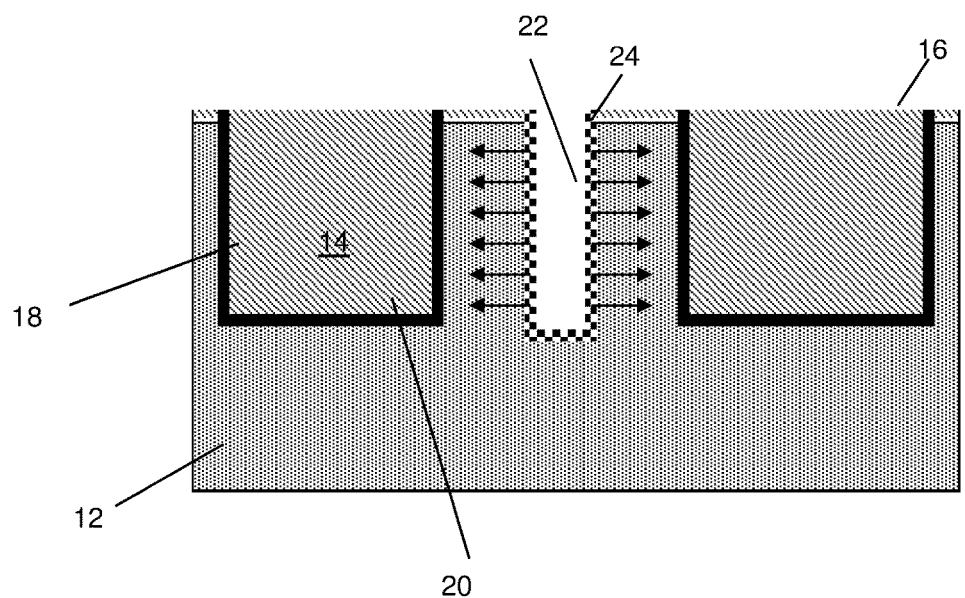
FIG. 4 shows doped conductive material on sidewalls of the source/drain trench, amongst other features, and respective fabrication processes in accordance with aspects of the present disclosure.

In FIG. 4, a doped conductive material 24 is deposited on sidewalls of the trench 22. In embodiments, the doped conductive material 24 can be a solid source dopant deposited on sidewalls of the trench 22. For example, the solid source dopant can be arsenic silicate glass (ASG) as example, which lines the sidewalls of the trench 22. The solid source dopant, e.g., doped conductive material 24, can be deposited by a conventional deposition process, e.g., ALD, chemical vapor deposition (CVD) or plasma vapor deposition (PVD), to a thickness of about 1 micron or other dimensions which will not result in a pinch-off of the trench 22. In this way, the trench 22 will remain open for additional processing, e.g., silicide process.

The doped conductive material 24 can be driven into the substrate 12 (as depicted by arrows) by an anneal process. For example, the solid source dopant, e.g., doped conductive material 24, can be diffused or driven into the substrate 12 by a 1100° C. dopant drive-in anneal. In this way, the solid source dopant will out-diffuse into the substrate 12, as shown by the arrows (and pattern shown in FIG. 8). Any doped conductive material on the surface of the substrate 12 (i.e., pad film 16) can be removed by a wet etch process, stopping on the pad film 16.

Figure 5:
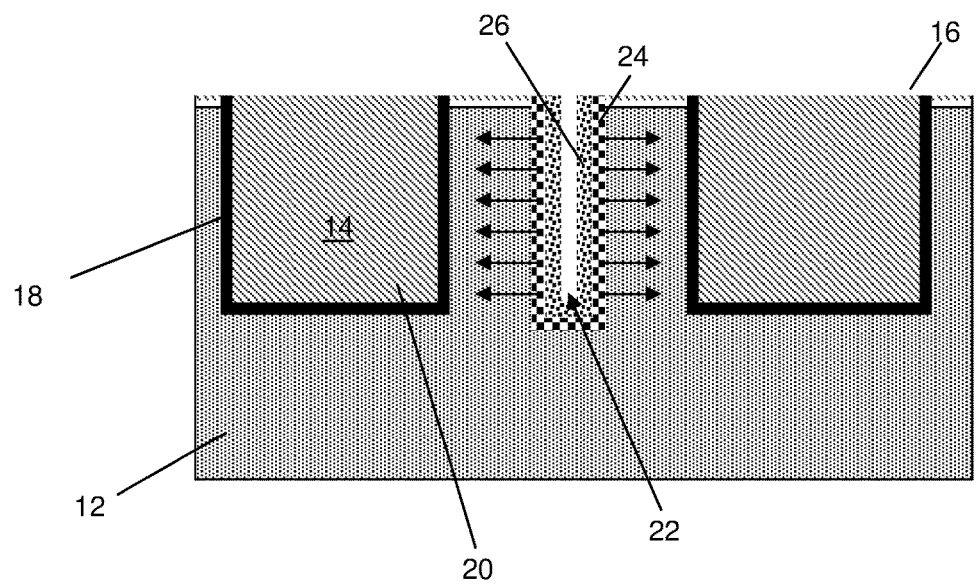
FIG. 5 shows a silicide formed over the doped conductive material on sidewalls of the source/drain trench, amongst other features, and respective fabrication processes in accordance with aspects of the present disclosure.

As shown in FIG. 5, a silicide 26 is formed over the doped conductive material 24 on the sidewalls of the trench 22. Typically, to form the silicide, the dopant, e.g., arsenic, is outdiffused into the silicon, e.g., substrate 12, and then the glass, if used as the solid source dopant, is stripped using selective chemistries in a conventional etching process as is known to those of skill in the art. At that point, silicide 26 can be formed directly on the doped silicon sidewalls. Accordingly, in FIG. 5, reference numeral 24 can be representative of outdiffusion of dopants into the silicon region (versus directly on doped glass, as an example). As an alternative, the deposited conducting material can be polysilicon, which can then stay in the trench and silicided directly thereon.

In embodiments, the silicide 26 can be a cobalt silicide process. As should be understood by those of skill in the art, the silicide process begins with deposition of a thin transition metal layer, e.g., cobalt, titanium, etc., over the doped conductive material 24. After deposition of the thin transition metal layer, the structure is heated allowing the transition metal to react in the active regions of the semiconductor device (e.g., source/drain) forming a low-resistance transition metal silicide 26. Following the reaction, any remaining transition metal is removed by chemical etching, leaving silicide contacts in the source/drain regions of the device.

Figure 6:
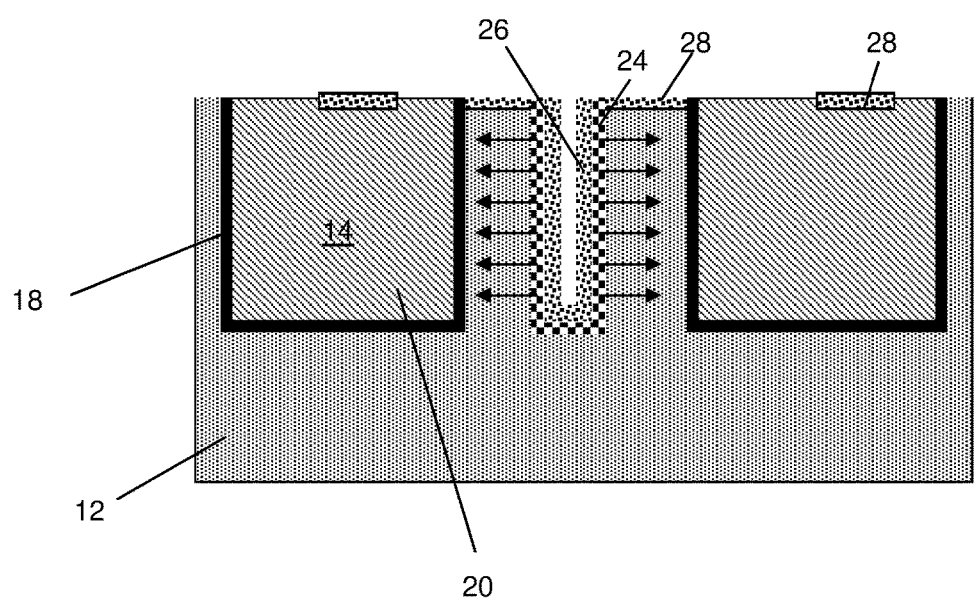
FIG. 6 shows a silicide on planar surfaces of the substrate, amongst other features, and respective fabrication processes in accordance with aspects of the present disclosure.

In FIG. 6, the pad film 16 can be removed followed by a silicide process on the surface of the substrate 12 (adjacent to the source/drain regions) to form silicide contacts 28 on the planar surface of the substrate 12. In embodiments, portions of the gate poly 20 will also undergo the silicide process to form silicide contacts 28. The silicide process to form silicide contacts 28 will be used with an oxide/nitride deposition and masking process as is well known to those of ordinary skill in the art such that no further explanation is required.

Figure 7:
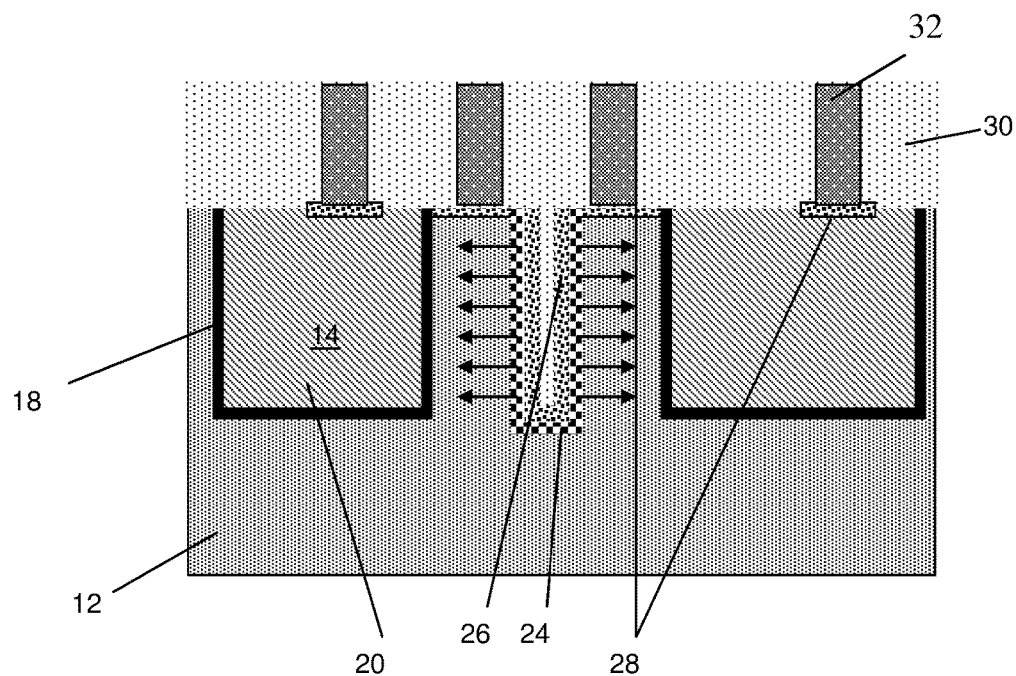
FIG. 7 shows middle of the line (MOL) structures, amongst other features, and respective fabrication processes in accordance with aspects of the present disclosure.

FIG. 7 shows middle of the line processes including the formation of contacts 32 on the silicide contacts 28. The contacts 32 are formed by a deposition of insulator material 30, e.g., oxide, followed by conventional lithography, etching and deposition processes, followed by lithography, etching and deposition of conductive material. The insulator material 30 can be deposited by a CVD process, which will fill any remaining portions of the trench 22. The contacts 32 can be tungsten or aluminum, as examples, formed within vias in the insulator material 30. After the deposition of the contact material, any excess material on the surface of the insulator material 30 can be removed by a conventional CMP process.

FIG. 8 shows a top planar view of the structure shown in FIG. 7. More specifically, FIG. 8 shows the source/drain trenches 22 with the silicide sidewalls 26 and filled with the oxide material 30. The source/drain trenches 22 are over and surrounded by the silicide 28 on the planar surface of the substrate 12. The source/drain trenches 22 are orthogonally positioned with respect to the gate trenches 14. In particular, the source/drain trenches 22 are orthogonally located at ends of the gate trenches 14. Gate channels 36 are provided between the gate trenches 14.

The gate trenches 14 include gate dielectric 18 on sidewalls thereof, with the remaining portions filled with gate material 20, e.g., gate poly or workfunction materials. The gate trenches 14 can be about 240 nm in length; although other dimensions are contemplated herein. The silicide 28 on the planar surface of the substrate 12 can extend to the edges of the gate trenches 14. The gate material 20 can also include silicide 28. Contacts 32 are directly contacting the silicide 28 on both the gate material 20 and the doped conductive material 24 of the source/drain. The switch, e.g., gate with source/drain, can be surrounded by oxide material 34.

Body contacts 38 can also be formed between the source/drain trenches 22. In embodiments, the body contacts 38 are p-type contacts; whereas, the source/drain regions are n-type source/drain for a N-type device. It should be understood though, that the body contacts 38 can be n-type contacts and the source/drain regions are p-type source/drain for a P-type device.

The structures described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a substrate material;
at least one vertically oriented gate structure extending into the substrate material and composed of a gate dielectric material and a conductive gate material;
vertically oriented source/drain regions extending into the substrate material and composed of conductive dopant material lining a first vertical trench and a silicide lining the conductive dopant material in the first vertical trench in the vertically oriented source/drain regions; and
an insulator material on the silicide lining the conductive dopant material and filling in a remaining portion of the first vertical trench.

2. The structure of claim 1, wherein:
the gate dielectric material and the conductive gate material are within a second vertical trench in the substrate material; and
the conductive dopant material and the silicide are provided in the first vertical trench, adjacent to the second vertical trench.

3. The structure of claim 2, wherein the gate dielectric material is an oxide on sidewalls of the second vertical trench and the conductive gate material is a poly material.

4. The structure of claim 2, wherein the gate dielectric material is a high-k dielectric material on sidewalls of the vertical trench and the conductive gate material is one or more workfunction materials.

5. The structure of claim 2, wherein the substrate material is bulk Si material, wherein the conductive dopant material lines a bottom surface and sidewalls of the first vertical trench thereby forming a "U" shape conductive dopant material region and the silicide lining the conductive dopant material in the first vertical trench forming a "U" shape silicide region, in a cross sectional view.

6. The structure of claim 2, wherein the vertically oriented source/drain regions are orthogonal to the at least one vertically oriented gate structure.

7. The structure of claim 2, wherein the conductive dopant material is a solid source dopant material.

8. The structure of claim 7, wherein the solid source dopant material lines sidewalls of the first vertical trench.

9. The structure of claim 8, wherein the solid source dopant material is arsenic silicate glass (AsG) or poly material.

10. The structure of claim 8, wherein the solid source dopant material out-diffuses into the substrate material and the silicide lining the conductive dopant material is directly on the substrate material.

11. The structure of claim 2, wherein the substrate material is a p-type substrate and the conductive dopant material outdiffuses into the substrate material.

12. The structure of claim 2, further comprising a silicide on a planar surface of the substrate material, adjacent to the conductive dopant material and on the conductive gate material and an oxide material over the silicide lining the conductive dopant material and filling in a remaining portion of the vertical trench.

13. A structure comprising:
   a substrate material;
   at least one vertically oriented gate trench extending into the substrate material;
   a gate dielectric material lining the at least one vertically oriented gate trench;
   a conductive gate material filling a remaining portion of the at least one vertically oriented gate trench;
   at least one vertically oriented source/drain trench extending into the substrate material;
   a conductive dopant material lining the at least one vertically oriented source/drain trench;
   a silicide lining the conductive dopant material in the at least one vertically oriented source/drain trench;
   a silicide on a planar surface of the substrate material, adjacent to the conductive dopant and on the conductive gate material; and
   an insulator material on the silicide lining the conductive dopant material and filling in a remaining portion of the at least one vertically oriented source/drain trench.

14. The structure of claim 13, wherein the gate dielectric material is an oxidation on sidewalls of the at least one vertically oriented gate trench and the conductive gate material is a poly material.

15. The structure of claim 13, wherein the gate dielectric material is a high-k dielectric material on sidewalls of the at least one vertically oriented gate trench and the conductive gate material is one or more workfunction materials.

16. The structure of claim 13, wherein the at least one vertically oriented source/drain trench are orthogonal to the at least one vertically oriented gate trench.

17. The structure of claim 13, wherein the conductive dopant material is a solid source dopant material comprising, in a cross sectional view, a "U" shape on sidewalls and a bottom the vertically oriented source/drain trench.

18. The structure of claim 17, wherein the solid source dopant out-diffuses into the substrate material.

19. The structure of claim 13, wherein the substrate is a p-type substrate.

20. A method comprising:
   forming at least one vertical trench in substrate material;
   lining the at least one vertical trench with a gate dielectric material;
   filling a remaining portion the at least one vertical trench with gate material;
   forming at least one vertically oriented source/drain trench;
   lining the at least one vertically oriented source/drain trench with a solid source dopant material; and
   siliciding a material on the solid source dopant material; and
   filling in a remaining portion the at least one vertically oriented source/drain trench with insulator material on the silicide.

* * * * *